United States Patent
Chen et al.

(10) Patent No.: US 12,267,003 B2
(45) Date of Patent: Apr. 1, 2025

(54) POWER CONVERTER AND CONTROL METHOD FOR POWER CONVERTER

(71) Applicant: Richtek Technology Corporation, Zhubei (TW)

(72) Inventors: Jung-Sheng Chen, Zhunan Township, Miaoli County (TW); Chih-Chun Chuang, Taichung (TW); Yong-Chin Lee, Tainan (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 245 days.

(21) Appl. No.: 18/145,267

(22) Filed: Dec. 22, 2022

(65) Prior Publication Data
US 2024/0128853 A1 Apr. 18, 2024

(51) Int. Cl.
*H02M 1/32* (2007.01)
*H02M 1/08* (2006.01)
*H02M 3/158* (2006.01)
*H03K 3/037* (2006.01)
*H03K 5/24* (2006.01)

(52) U.S. Cl.
CPC ............... *H02M 1/32* (2013.01); *H02M 1/08* (2013.01); *H02M 3/158* (2013.01); *H03K 3/037* (2013.01); *H03K 5/24* (2013.01)

(58) Field of Classification Search
CPC ............ H02M 1/32; H02M 1/36; H02M 1/38; H02M 1/40; H02M 1/08; H02M 3/158; H02M 3/157; H02M 3/1566; H02M 3/156; H02M 3/037
See application file for complete search history.

(56) References Cited

U.S. PATENT DOCUMENTS

| | | | |
|---|---|---|---|
| 8,138,734 B2* | 3/2012 | Xi | H02M 3/156 323/283 |
| 2006/0071651 A1* | 4/2006 | Ito | H02M 3/1588 323/351 |
| 2014/0218000 A1* | 8/2014 | Su | H02M 3/156 323/282 |
| 2016/0306371 A1* | 10/2016 | Svorc | H02M 3/1588 |

FOREIGN PATENT DOCUMENTS

TW I646766 B 1/2019

* cited by examiner

*Primary Examiner* — Nguyen Tran
(74) *Attorney, Agent, or Firm* — McClure, Qualey & Rodack, LLP

(57) ABSTRACT

A power converter that properly copes with the wiring defects on a feedback path is shown. According to a control signal, a power driver couples an input voltage to an energy storage element to provide an output voltage that is down-converted from the input voltage. The output voltage is further converted into a feedback voltage by a feedback circuit, and is entered to an error amplifier with a reference voltage for generation of an amplified error. A control signal generator generates the control signal of the power driver according to the amplified error. The power converter specifically has a comparator, which is enabled in a soft-start stage till the output voltage reaches a stable status. The comparator compares the amplified error with a critical value. When the amplified error exceeds the critical value, the input voltage is disconnected from the energy storage element.

14 Claims, 4 Drawing Sheets

POWER CONVERTER AND CONTROL METHOD FOR POWER CONVERTER

CROSS REFERENCE TO RELATED APPLICATIONS

This application claims priority of Taiwan Patent Application No. 111139422, filed on Oct. 18, 2022, the entirety of which is incorporated by reference herein.

BACKGROUND OF THE INVENTION

Field of the Invention

The present invention relates to a power converter, and, in particular, to a buck converter.

Description of the Related Art

A buck power converter down-converts an input voltage into an output voltage to supply power to a low-voltage device. If the output voltage generated by the power converter is not at its proper level, the driven load may become damaged. For example, the circuit may have wiring defects or the circuit wiring may wear with time, resulting in a broken feedback path for the output voltage. Due to such wrong feedback, the power converter may continuously supply energy to push up the output voltage. This huge output voltage may damage the load, which should be operating at a lower voltage level. In another situation, the output terminal of the power converter may not be grounded correctly, causing the power converter to continuously drain energy from the input voltage and then become damaged.

BRIEF SUMMARY OF THE INVENTION

A power converter down-converting an input voltage to an output voltage is shown, which is capable of properly deal with the broken feedback path or the erroneously grounded output terminal.

A power converter in accordance with an exemplary embodiment of the present invention has an energy storage element, a power driver, a feedback circuit, an error amplifier, a control signal generator and a first comparator. According to a control signal, the power driver couples the input voltage to the energy storage element to drive the energy storage element to provide the output voltage. The feedback circuit generates a feedback voltage based on the output voltage. The error amplifier receives the feedback voltage as well as a reference voltage for generation of an amplified difference. The control signal generator generates the control signal based on the amplified error generated by the error amplifier, to provide the control signal to operate the power driver. The first comparator is enabled in a soft-start stage till the output voltage reaches a stable status, to compare the amplified error with a critical value. When the first comparator shows that the amplified error is greater than the critical value, the input voltage is disconnected from the energy storage element.

In such a design, before the power converter starts to really provide power to drive the connected device, the circuit wiring problems about a broken feedback path or an erroneously grounded output terminal is timely discovered.

In an exemplary embodiment, the control signal generator has a pulse width modulation (PWM) signal generator, and a second comparator. The PWM signal generator generates a PWM signal to be transformed into the control signal for operating the power driver. The second comparator compares the amplified error with the feedback current of the power converter to output a comparison result to the PWM signal generator to adjust a duty cycle of the PWM signal. In an exemplary embodiment, the power converter further has a current detector and a slope compensator. The current detector detects a current generated while the input voltage is coupled to the energy storage element. The slope compensator compensates for a variation slope of the current detected by the current detector, to generate the feedback current to be coupled to the current detector. In such a circuit structure, the critical value depends on a direct-current voltage, a slope voltage, a current detection voltage, and a fault tolerance. The direct-current voltage is a direct-current offset for the output range of the error amplifier. The slope voltage depends on the electrical characteristics of the slope compensator. The current detection voltage depends on the electrical characteristics of the current detector. In an exemplary embodiment, the critical value further depends on the transform ratio between the output voltage and the input voltage, and the loading status. For the different transform ratios or the different loading statuses, the critical value may be different.

In an exemplary embodiment, the power converter is switched to disconnecting the input voltage from the energy storage element after the first comparator detects that the amplified error has been greater than the critical value for longer than a predetermined time interval.

In an exemplary embodiment, a control method is shown to control a power converter that down-converts an input voltage to an output voltage. In a soft-start stage, an amplified error generated by an error amplifier of the power converter is monitored till the output voltage reaches a stable status. The power converter uses a feedback circuit to generate a feedback voltage based on the output voltage. The output voltage and a reference voltage are sent to the error amplifier to generate the amplified error. The amplified error is used in the generation of a control signal. A power driver of the power converter couples the input voltage to an energy storage element based on the control signal to drive the energy storage element to provide the output voltage. The control method further compares the amplified error with a critical value. When the amplified error is greater than the critical value, the control method disconnects the input voltage from the energy storage element.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
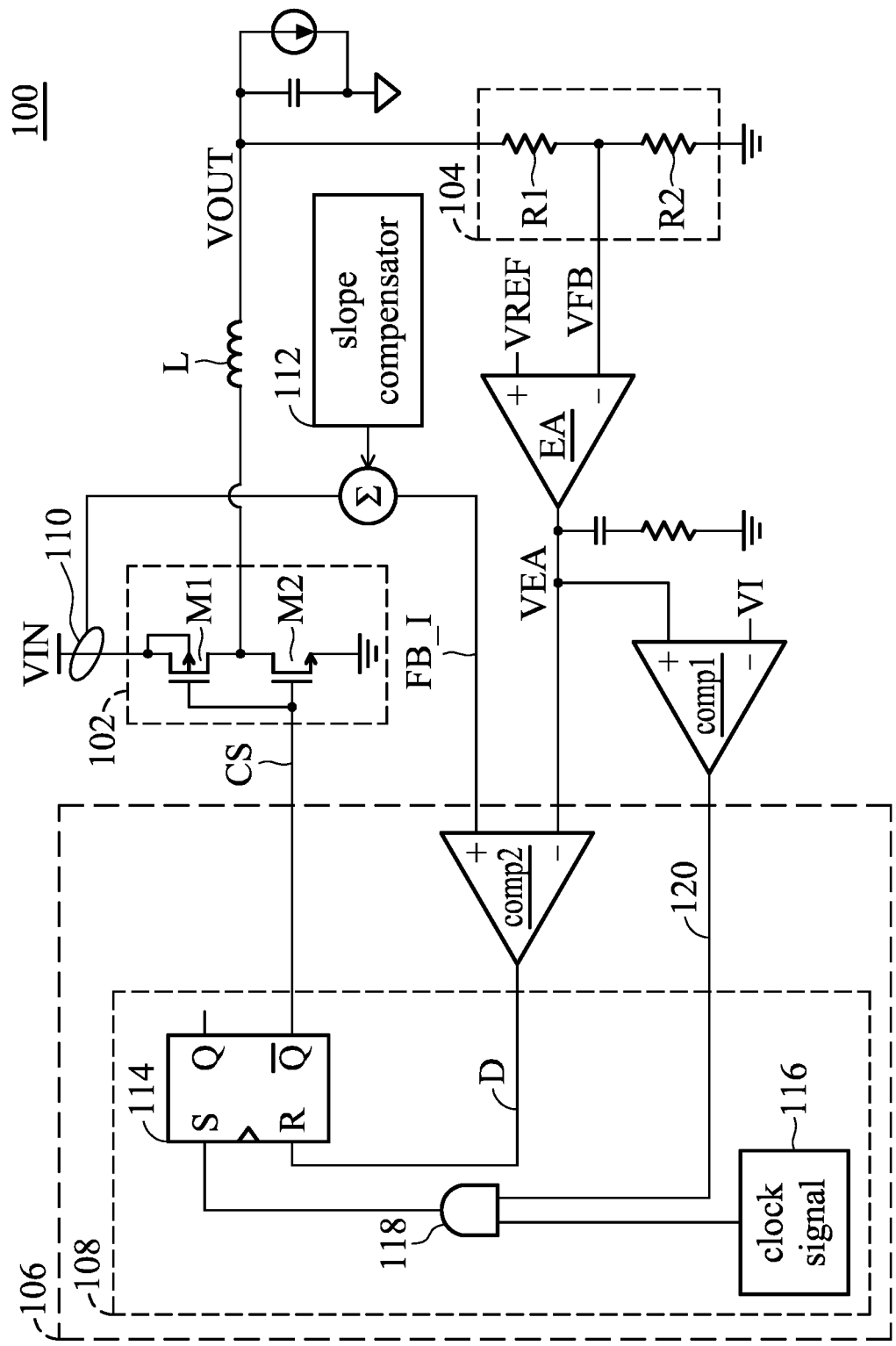
FIG. 1 depicts a power converter 100 in accordance with an exemplary embodiment of the present invention, which is a buck converter that down-converts an input voltage VIN to an output voltage VOUT.

The following description is made for the purpose of illustrating the general principles of the invention and should not be taken in a limiting sense. The scope of the invention is best determined by reference to the appended claims.

FIG. 1 depicts a power converter 100 in accordance with an exemplary embodiment of the present invention, which is a buck converter that down-converts an input voltage VIN to an output voltage VOUT. The power converter 100 has an energy storage element L, a power driver 102, a feed circuit 104, an error amplifier EA, a control signal generator 106, and, especially, a comparator comp1.

The power driver 102 couples the input voltage VIN to the energy storage element L according to the control signal CS to drive the energy storage element L to provide the output current VOUT. The feedback circuit 104 converts the output voltage VOUT to a feedback voltage VFB. As shown, two resistors R1 and R2 form a voltage divider to implement the feedback circuit 104. The error amplifier EA receives the feedback voltage VFB and a reference voltage VREF to generate an amplified error VEA. According to the amplified error VEA, the control signal generator 106 generates the control signal CS to operate the power driver 102.

However, the circuit wiring may have defects or may be damaged to break the feedback path of the output voltage VOUT. Through the resistor R2, the feedback voltage VFB may be erroneously pulled down to the ground level. The error amplifier EA, therefore, keeps detecting the huge difference between the feedback voltage VFB and the reference voltage VREF and continuously charges the output load of the error amplifier EA. Thus, the amplified error VEA continuously increases and is away from its stable value (which should be a fixed value). In response to the increasing amplified error VEA, the control signal generator 106 generating the control signal CS may operate the power driver 102 to continuously couple the input voltage VIN to the energy storage element L. The output voltage VOUT, therefore, increases excessively, and so that the low-voltage load coupled to the power driver 100 is damaged.

In another situation, the output terminal (also represented by VOUT) of the power converter 100 may be erroneously wired to the ground terminal. The feedback voltage VFB at the ground level also makes the amplified error VEA to increase excessively. The control signal CS generated by the control signal generator 106 operates the power drover 102 to continuously couple the input voltage VIN to the energy storage element L. The power converter 100, therefore, continuously drains power from the input voltage VIN, and may be damaged.

The aforementioned circuit defects may be detected by the comparator comp1. The comparator comp1 can accurately detect the broken feedback path of the output voltage VOUT or the erroneously grounded output terminal (grounded VOUT).

In a soft-start stage, the comparator comp1 is enabled till the output voltage VOUT reaches its stable status. The comparator comp1 compares the amplified error VEA with a critical value VI. When the comparator comp1 determines that the amplified error VEA is greater than the critical value VI, the input voltage VIN is disconnected from the energy storage element L. For a broken feedback path of the output voltage VOUT, the procedure that disconnects the input voltage VIN from the energy storage element L can limit the output voltage VOUT and thereby the low-voltage load is protected from being damaged. If the output terminal VOUT is grounded by the defective circuit wiring, the procedure that disconnects the input voltage VIN from the energy storage element L can protect the power converter 100 from being damaged by the power drained from the input voltage VIN.

In an exemplary embodiment, when the comparator comp1 determines that the amplified error VEA has been greater than the critical value VI for a predetermined time interval, the power converter 100 is switched to disconnecting the input voltage VIN from the energy storage element L to avoid accidentally starting such a protection mechanism.

FIG. 1 further exemplifies the details of the control signal generator 106. The control signal generator 106 includes a pulse width modulation (PWM) signal generator 108 and a comparator comp2. The PWM signal generator 108 generates a PWM signal. The control signal CS operating the power driver 102 is generated based on the PWM signal. The comparator comp2 performs comparison based on the amplified error VEA and a feedback current FB_I of the power converter 100, to output a comparison result D to the PWM signal generator 108 to adjust the duty cycle of the PWM signal to generate the proper control signal CS. In an exemplary embodiment, once the comparator comp1 detects a circuit defect (i.e., the amplified error VEA has being greater than the critical value VI for a predetermined time interval), the PWM signal stops its PWM oscillation, and the duty cycle is zero. The control signal CS adjusted with the PWM signal, therefore, stops connecting the input voltage VIN to the energy storage element L.

This paragraph introduces a method for generating the feedback current FB_I. As shown in FIG. 1, the power converter 100 further includes a current detector 110 and a slope compensator 112. The current detector 110 detects a current that is generated by coupling the input voltage VIN to the energy storage element L. The slope compensator 112 compensates for the variation slope of the current detected by the current detector 110, and generates the feedback current FB_I to the comparator comp2.

According to the circuit structure of FIG. 1, the critical value VI received by the comparator comp1 can have the following design. The critical value VI can be set based on a direct-current voltage VDC, a slope voltage VSlope, a current detection voltage VSns, and a fault tolerance Vtol. The direct-current voltage VDC is a direct-current offset for the output range of the error amplifier EA. The slope voltage VSlope is related to the electrical characteristics of the slope compensator 112. The current detection voltage VSns is related to the electrical characteristics of the current detector 110.

For example, under ideal conditions, the amplified error VEA is:

$$VEA = VDC + VSlope + VSns$$

In an exemplary embodiment, the critical value VI is:

$$VI = VDC + VSlope + VSns + Vtol$$

In an exemplary embodiment, the critical value VI is set according to the transform ratio (VOUT/VI) of the output voltage VOUT and the input voltage VI, and the loading of the power converter 100. For example, the fault tolerance Vtol can be set to cope with the various transform ratios (VOUT/VI) and the various load conditions.

The other circuit details of FIG. 1 are described below.

The error amplifier EA uses a positive input terminal '+' to receive the reference voltage VREF, and uses a negative input terminal '−' to receive the feedback voltage VFB. The comparator comp1 uses a positive input terminal '+' to receive the amplified error VEA, and uses a negative input terminal '−' to receive the critical value VI. The comparator comp2 uses a positive input terminal '+' to receive the feedback current FB_I, and uses a negative input terminal '−' to receive the amplified error VEA. The PWM signal generator 108 has an S-R latch 114, which has an S input terminal receiving a clock signal 116, an R input terminal coupled to an output terminal D of the comparator comp2. The S-R latch 114 generates a PWM signal, which is presented at a Q output terminal (also represented in the oscillation at the $\overline{Q}$ output terminal). FIG. 1 shows that the S-R latch 114 uses a $\overline{Q}$ output terminal to receive the control signal CS. The power driver 102 includes a PMOS M1 and an NMOS M2. The PMOS M1 has a gate terminal coupled to the Q output terminal of the S-R latch 114. Thus, the input voltage VIN is coupled to the energy storage element L according to the PWM oscillation presented in the control signal CS. The NMOS M2 has a gate terminal coupled to the $\overline{Q}$ output terminal of the S-R latch 114. Thus, the energy storage element L disconnected from the input voltage VIN is coupled to the ground terminal according to the PWM oscillation presented in the control signal CS.

In particular, the PWM signal generator 108 further has a logic gate 118 (e.g., an AND gate). The clock signal 116 and an output signal 120 of the comparator comp1 are sent to the logic gate 118 for calculation, and the output of the logic gate 118 is applied to control the S input terminal of the S-R latch 114. Once the comparator comp1 determines that the amplified error VEA is greater than the critical value VI, the control signal CS disconnects the input voltage VIN from the energy storage element L.

In another exemplary embodiment, the determination result 120 of the comparator comp1 is passed to the control center of the electronic system (e.g., a controller of an electronic device). According to the determination result 120, the control center of the electronic system stops the PWM signal generator 108 to output the PWM oscillation. Thus, the input voltage VIN is disconnected from the energy storage element L.

The above techniques for detecting the amplified error VEA can be applied to various power converters.

Figure 2:
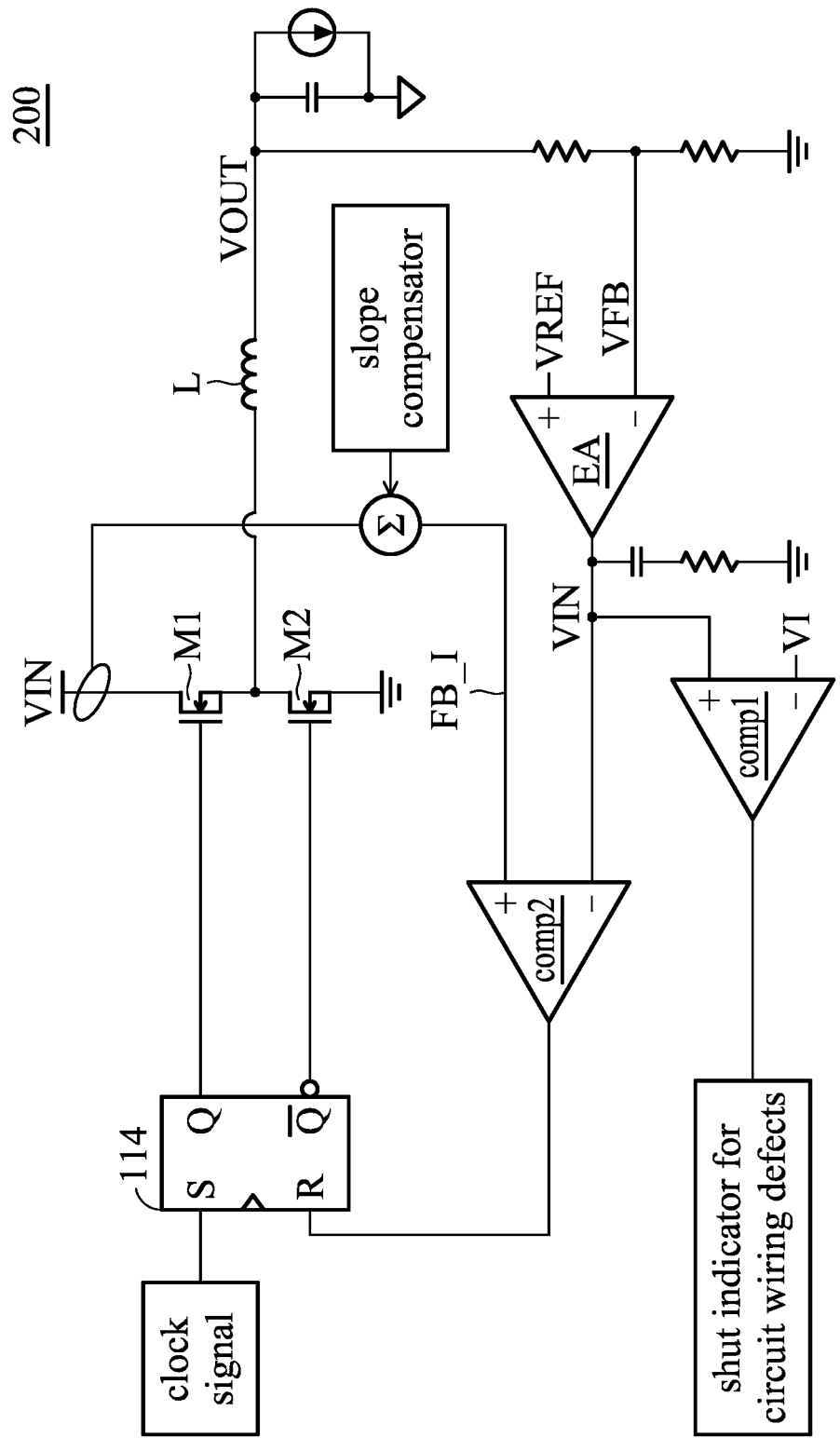
FIG. 2 depicts a power converter 200 in accordance with another exemplary embodiment of the present invention.

FIG. 2 depicts a power converter 200 in accordance with another exemplary embodiment of the present invention. The power driver has two NMOSs M1 and M2, which are operated according to the control signal CS obtained from the $\overline{Q}$ output terminal and the Q output terminal of the S-R latch 114. As shown in FIG. 2, the NMOS M1 has a gate terminal coupled to the Q output terminal of the S-R latch 114. The NMOS M2 has a gate terminal coupled to the $\overline{Q}$ output terminal of the S-R latch 114. The power driver of the power converter 200 is slightly different from that used in the power converter 100. However, the power converter 200 also uses the comparator comp1 to accurately detect the broken feedback path of the output voltage VOUT, or the wiring defect that erroneously connects the output terminal (VOUT) to the ground terminal.

In addition, the energy storage element L may have the other variations, and may be replaced by the other energy storage elements or circuits.

Figure 3:
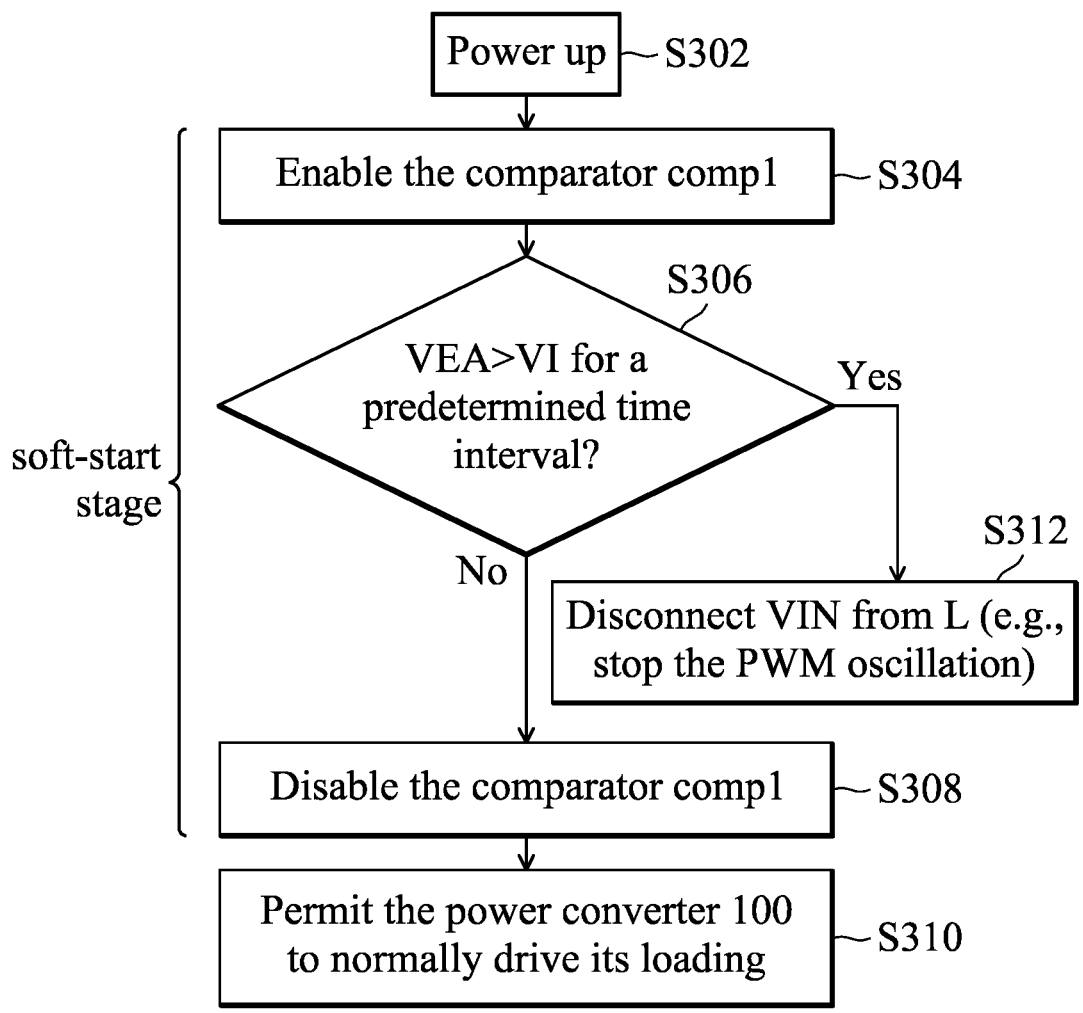
FIG. 3 is a flowchart about a control method for a power converter in accordance with an exemplary embodiment of the present invention.

FIG. 3 is a flowchart about a control method for a power converter in accordance with an exemplary embodiment of the present invention. The method is described with reference to the power converter 100 of FIG. 1.

In step S302, an electronic system with the power converter 100 is powered up. The electronic system enters a soft-start stage. In step S304, the comparator comp1 is enabled to monitor the amplified error VEA. In an exemplary embodiment, the enable interval of the comparator comp1 is fixed (not limited thereto). In step S306, the enabled comparator comp1 determines whether the amplified error VEA has been greater than the critical value VI for the predetermined time interval. If the enabled comparator comp1 does not detect any malfunction of the amplified error VEA, the flow proceeds to step S308 to disable the comparator comp1, and the power converter 100 is confirmed not containing any circuit defects. The feedback path the output voltage VOUT is fine, and no wrong wiring connecting the output terminal (VOUT) to the ground. When the output voltage VOUT reaches its stable status, the electronic system ends the soft-start stage. In step S310, the electronic system permits the power converter 100 to normally drive its loading.

When step S306 shows that the comparator comp1 actually detects the malfunction of the amplified error VEA, the flow proceeds to step S312. The PWM oscillation is stopped, and so that the input voltage VIN is no longer connected to the energy storage element L. This is a solution to the broken feedback path of the output voltage VOUT or the wiring defect that erroneously connects the output terminal VOUT to the ground.

Figure 4:
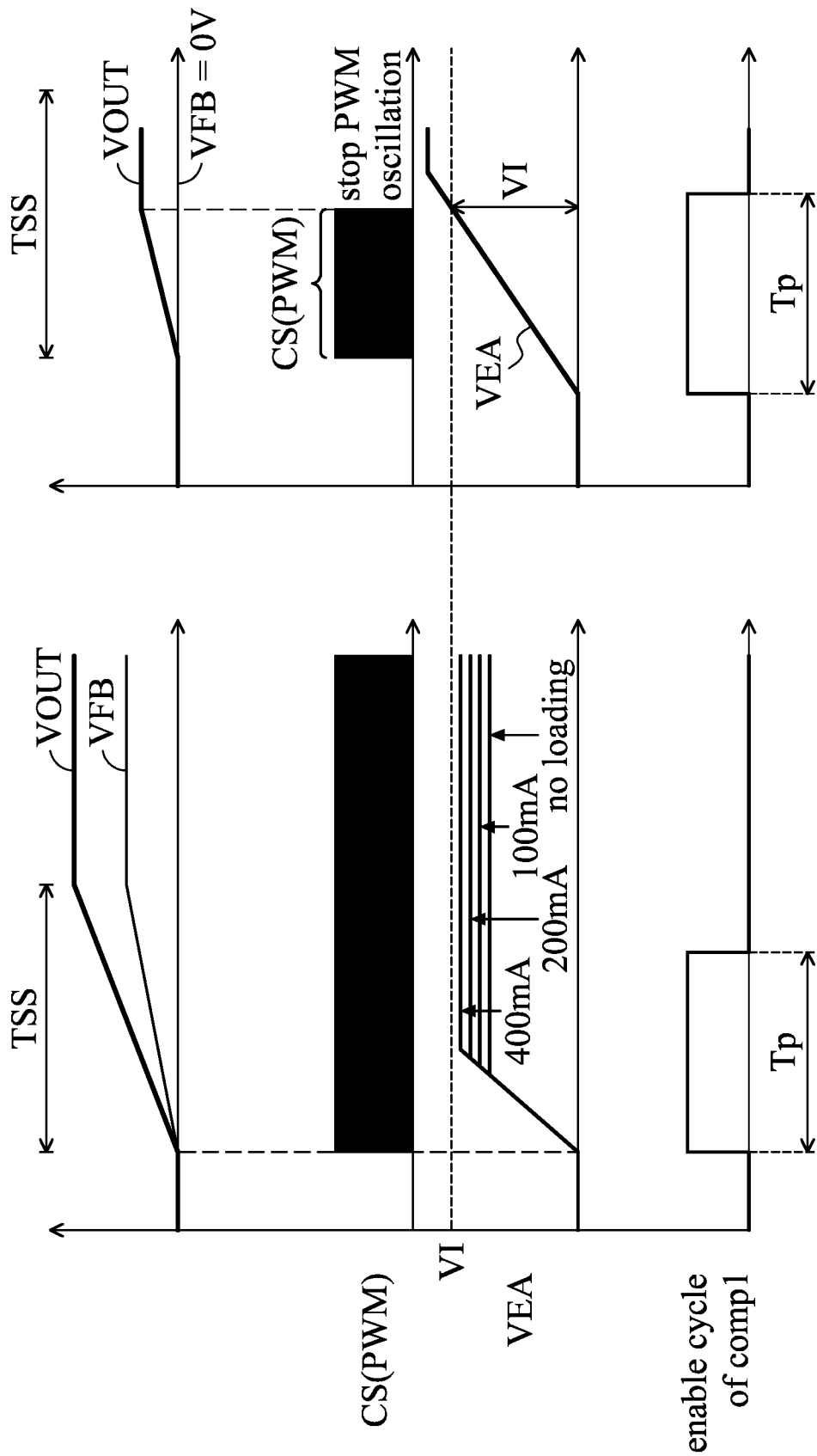
FIG. 4 is a waveform diagram.

FIG. 4 is a waveform diagram. The left waveforms show the operations of a normal power converter (without any circuit defects), and the right waveforms show the operations of a defective power converter (with the aforementioned circuit defects). In the soft-start stage (TSS), the disclosed comparator comp1 is enabled for a time interval Tp. The left waveforms show that when there is no defect in the circuit, the amplified error VEA will reach and stay at its stable status no matter what loading status (400 mA, 200 mA, 100 mA, or no load) the power converter is. Considering the different loading situations, the critical value VI can be defined to be the stable status (±a fault tolerance). Referring to the right waveforms, the defective circuit will cause the amplified error VEA exceeding the critical value VI in the enable interval Tp. In this case, the PWM oscillation generating the control signal CS is stopped. The input voltage VIN is disconnected from the energy storage element L. The output voltage VOUT is limited within a safe range.

In conclusion, any technology monitoring an amplified error VEA at an output terminal of an error amplifier EA of a buck converter should be considered within the scope of the present invention.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power converter, down-converting an input voltage to an output voltage, comprising:
  an energy storage element;
  a power driver, driving the energy storage element to provide the output voltage by coupling the input voltage to the energy storage element according to a control signal;
  a feedback circuit, generating a feedback voltage based on the output voltage;
  an error amplifier, receiving the feedback voltage as well as a reference voltage for generation of an amplified error;

a control signal generator, generating the control signal based on the amplified error generated by the error amplifier, to provide the control signal to operate the power driver; and a first comparator, enabled in a soft-start stage till the output voltage reaches a stable status, to compare the amplified error with a critical value;

wherein:

the input voltage is disconnected from the energy storage element when the first comparator enabled in the soft-start stage shows that the amplified error is greater than the critical value;

the control signal generator comprises a pulse width modulation signal generator and a second comparator, wherein the pulse width modulation signal generator generates a pulse width modulation signal to be transformed into the control signal for operating the power driver, and the second comparator compares the amplified error with a feedback current of the power converter to output a comparison result to the pulse width modulation signal generator to adjust a duty cycle of the pulse width modulation signal;

the power converter further comprises a current detector and a slope compensator, wherein the current detector detects a current generated while the input voltage is coupled to the energy storage element, and, the slope compensator compensates for a variation slope of the current detected by the current detector, to generate the feedback current to be coupled to the current detector;

the critical value depends on a direct-current voltage, a slope voltage, a current detection voltage, and a fault tolerance;

the direct-current voltage is a direct-current offset for an output range of the error amplifier;

the slope voltage depends on electrical characteristics of the slope compensator; and the current detection voltage depends on electrical characteristics of the current detector.

2. The power converter as claimed in claim 1, wherein:
the critical value further depends on a transform ratio between the output voltage and the input voltage, and a loading status.

3. The power converter as claimed in claim 1, wherein:
the energy storage element includes an inductor;
the power driver includes a first transistor and a second transistor;
the first transistor is controlled by the pulse width modulation signal to couple the input voltage to the inductor; and
the second transistor is controlled by the pulse width modulation signal to couple the inductor to a ground terminal while the input voltage has been disconnected from the inductor.

4. The power converter as claimed in claim 3, wherein:
the pulse width modulation signal generator has an S-R latch;
the S-R latch has an S input terminal receiving a clock signal, and an R input terminal coupled to an output terminal of the second comparator;
the S-R latch further has a Q output terminal and a $\overline{Q}$ output terminal; and
at least one of the Q output terminal and $\overline{Q}$ output terminal is coupled to the first transistor and the second transistor, to operate the first transistor and the second transistor according to the pulse width modulation signal.

5. The power converter as claimed in claim 4, wherein:
the error amplifier uses a positive input terminal to receive the reference voltage, and a negative input terminal to receive the feedback voltage.

6. The power converter as claimed in claim 5, wherein:
the first comparator has a positive input terminal coupled to the amplified error, and a negative input terminal coupled to the critical value.

7. The power converter as claimed in claim 6, wherein:
the second comparator has a positive input terminal coupled to the feedback current, and a negative input terminal coupled to the amplified error.

8. The power converter as claimed in claim 7, wherein:
the first transistor is a PMOS, having a gate terminal coupled to the $\overline{Q}$ output terminal of the S-R latch; and
the second transistor is an NMOS, having a gate terminal coupled to the $\overline{Q}$ output terminal of the S-R latch.

9. The power converter as claimed in claim 7, wherein:
the first transistor is an NMOS, having a gate terminal coupled to the Q output terminal of the S-R latch; and
the second transistor is an NMOS, having a gate terminal coupled to the $\overline{Q}$ output terminal of the S-R latch.

10. The power converter as claimed in claim 7, wherein:
the pulse width modulation signal generator further has a logic gate; and
the clock signal and an output signal of the first comparator are processed by the logic gate and then used in the control of the S input terminal of the S-R latch.

11. The power converter as claimed in claim 1, wherein:
the input voltage is disconnected from the energy storage element after the first comparator detects that the amplified error has been greater than the critical value for longer than a predetermined time interval.

12. A control method for a power converter that down-converts an input voltage to an output voltage, comprising:
in a soft-start stage, comparing an amplified error generated by an error amplifier of the power converter with a critical value till the output voltage reaches a stable status; and
when the amplified error is greater than the critical value, disconnecting the input voltage from an energy storage element of the power converter;

wherein:

the power converter uses a feedback circuit to generate a feedback voltage based on the output voltage, the output voltage and a reference voltage are sent to the error amplifier to generate the amplified error, the amplified error is used in generation of a control signal, and a power driver of the power converter couples the input voltage to the energy storage element based on the control signal to drive the energy storage element to provide the output voltage;

the control signal is generated based on a pulse width modulation signal;

the amplified error is further compared with a feedback current of the power converter to adjust a duty cycle of the pulse width modulation signal;

the control method further comprises providing a current detector to detect a current generated by connecting the input voltage to the energy storage element, and providing a slope compensator to generate the feedback current to compensate for a variation slope of the current detected by the current detector;

the critical value depends on a direct-current voltage, a slope voltage, a current detection voltage, and a fault tolerance;

the direct-current voltage is a direct-current offset for an output range of the error amplifier;

the slope voltage depends on electrical characteristics of the slope compensator; and the current detection voltage depends on electrical characteristics of the current detector.

13. The control method as claimed in claim 12, wherein:
the critical value further depends on a transform ratio between the output voltage and the input voltage, and a loading status.

14. The control method as claimed in claim 12, which switches to disconnect the input voltage from the energy storage element after detecting that the amplified error has been greater than the critical value for longer than a predetermined time interval.

\* \* \* \* \*